(12) United States Patent
Ahmed et al.

(10) Patent No.: US 9,461,593 B1
(45) Date of Patent: Oct. 4, 2016

(54) CURRENT-MODE FOLDING AMPLIFIER

(71) Applicant: KING FAHD UNIVERSITY OF PETROLEUM AND MINERALS, Dhahran (SA)

(72) Inventors: Mohanad Ahmed Mohammed Elhassan Ahmed, Khartoum (SD); Sagar Kumar Dhar, Dhahran (SA); Munir Kulaib Al-Absi, Dhahran (SA); Muhammad Taher Abuelma'atti, Dhahran (SA)

(73) Assignee: KING FAHD UNIVERSITY OF PETROLEUM AND MINERALS DHAHRAN (SA)

( * ) Notice: Subject to any disclaimer, the term of this patent is extended or adjusted under 35 U.S.C. 154(b) by 0 days.

(21) Appl. No.: 14/995,162

(22) Filed: Jan. 13, 2016

(51) Int. Cl.
*H03M 1/12* (2006.01)
*H03F 3/16* (2006.01)
*H03F 1/02* (2006.01)

(52) U.S. Cl.
CPC ............. *H03F 1/0205* (2013.01); *H03F 3/16* (2013.01); *H03F 2200/129* (2013.01); *H03F 2200/555* (2013.01)

(58) Field of Classification Search
USPC .................................. 330/288; 341/155–161
See application file for complete search history.

(56) References Cited

U.S. PATENT DOCUMENTS

| | | | |
|---|---|---|---|
| 6,972,706 B2 | 12/2005 | Snoeijs | |
| 8,547,269 B2 | 10/2013 | El-Chammas | |
| 8,610,614 B1 | 12/2013 | Al-Absi et al. | |
| 2010/0289580 A1 | 11/2010 | Standley et al. | |
| 2012/0092202 A1* | 4/2012 | Petrellis | H03M 1/368 341/155 |

OTHER PUBLICATIONS

Al-Absi et al., "A new CMOS current mode fast folding amplifier," 2014 21st IEEE International Conference on Electronics, Circuits and Systems (ICECS), pp. 183-186, Dec. 7-10, 2014.
R.-M. Weng and C.-C. Chao, "A 1.5 v high folding rate current-mode folding amplifier for folding and interpolating ADC," in 2006 IEEE International Symposium on Circuits and Systems, 2006. ISCAS 2006. Proceedings, May 21-24, 2006.
Flynn et al., "CMOS folding A/D converters with current-mode interpolation," IEEE Journal of Solid-State Circuits, vol. 31, Issue 9, pp. 1248-1257, Aug. 6, 2002.

* cited by examiner

*Primary Examiner* — Hieu Nguyen
(74) *Attorney, Agent, or Firm* — Richard C. Litman (57) ABSTRACT

The current-mode folding amplifier is a current-mode sawtooth folding amplifier having a minimal number of current mirrors in the signal path from input to output. This minimizes the delays imposed by current mirrors on the speed of the amplifier. The amplifier has a full scale delay of 5.9 ns. The operation of the amplifier is verified in simulation using LFoundry 150 nm process in Cadence Tools.

5 Claims, 12 Drawing Sheets

CURRENT-MODE FOLDING AMPLIFIER

BACKGROUND OF THE INVENTION

1. Field of the Invention

The present invention relates generally to amplifiers in analog-to-digital converters (ADCs), and particularly to a current-mode folding amplifier characterized by the number of folds, N, and the fold size $I_F$.

2. Description of the Related Art

Analog-to-digital converters (ADCs) are one of the most important sub-circuits of any digital system that is intended to interface with the analog world. Because of their ubiquitous presence, ADCs with high speed, compact form factor, low voltage, and low power are highly desirable. There are different architectures of ADCs available in the literature, among which full flash ADC is the fastest and simplest one. However, this kind of ADCs requires $2^N-1$ comparators and $2^N$ resistors, where N is the number of bits, which causes such topology to be impractical for higher number of bits. One of the solutions is a folding ADC, which reduces the number of comparators, and hence the power and size of the ADC, with a minimum compromise in the conversion speed. Folding ADCs require a folding amplifier, and for accuracy of conversion, saw-tooth folding characteristics are highly desirable. Moreover, current-mode implementation can offer low voltage and faster response. Thus, current-mode folding amplifiers with saw-tooth transfer characteristics and faster response are of interest.

Conventional voltage-mode folding amplifiers are built around differential amplifiers. Different folding ADCs have been reported utilizing voltage-mode folding amplifiers, which had either sinusoidal or triangular folding characteristics. Folding ADCs with such folding characteristics cause error in digitization and need extra error correction/compensation circuitry. Moreover, such voltage-mode folding amplifiers will not be suitable for low voltage application due to the non-linearity of the differential amplifiers used for folding amplifier realization.

Thus, a current-mode folding amplifier solving the aforementioned problems is desired.

SUMMARY OF THE INVENTION

The current-mode folding amplifier is a current-mode saw-tooth folding amplifier having a minimal number of current mirrors in the signal path from input to output. This minimizes the delays imposed by current mirrors on the speed of the amplifier. The amplifier has a full scale delay of 5.9 ns, which is more than four times faster than presented in previous literature. The operation is verified in simulation using LFoundry 150 nm process in Cadence Tools.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The current-mode folding amplifier is a current-mode saw-tooth folding amplifier having a minimal number of current mirrors in the signal path from input to output. This minimizes the delays imposed by current mirrors on the speed of the amplifier. The amplifier has a full scale delay of 5.9 ns, which is more than four times faster than presented in previous literature. The operation is verified in simulation using LFoundry 150 nm process in Cadence Tools.

Figure 1:
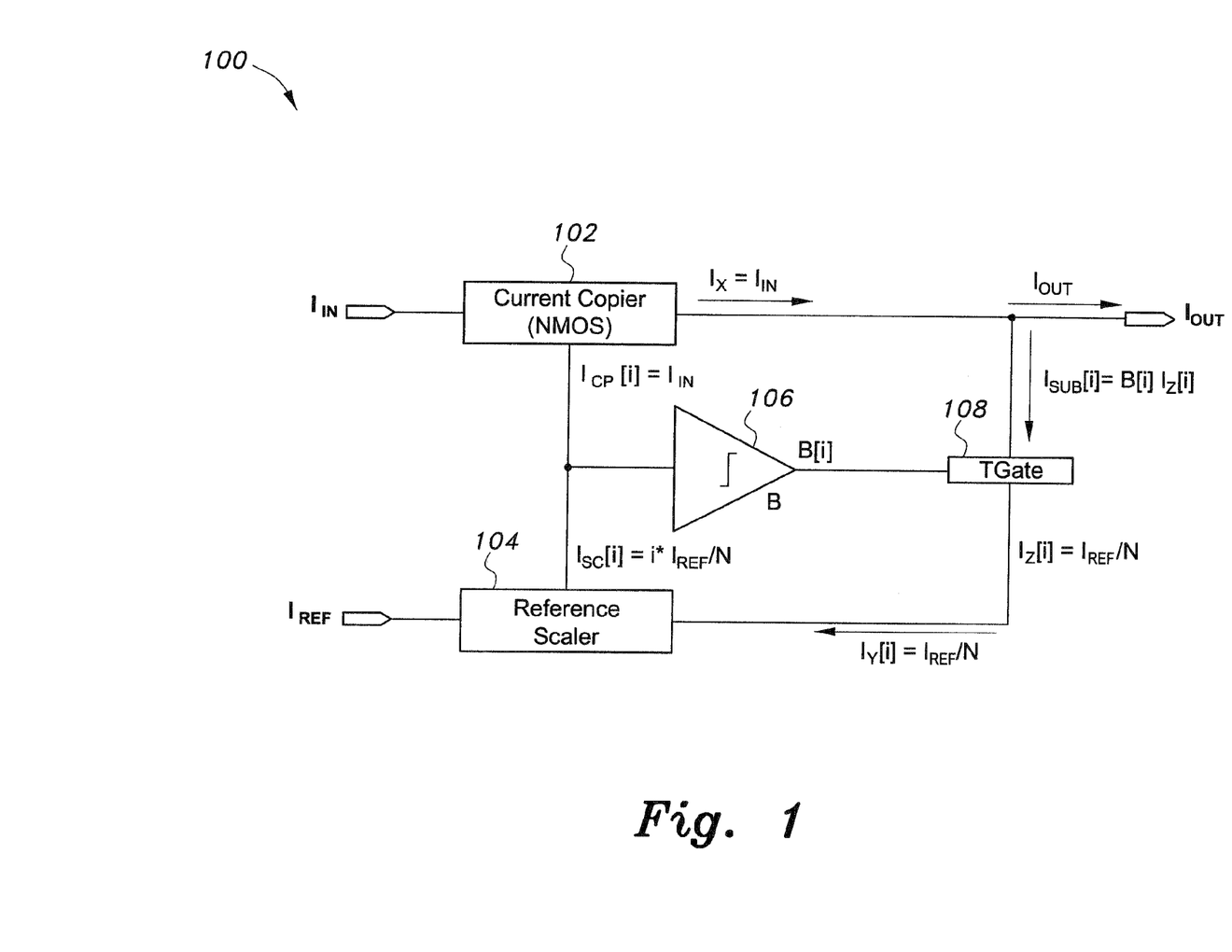
FIG. 1 is a block diagram of a current-mode folding amplifier according to the present invention.
Figure 2:
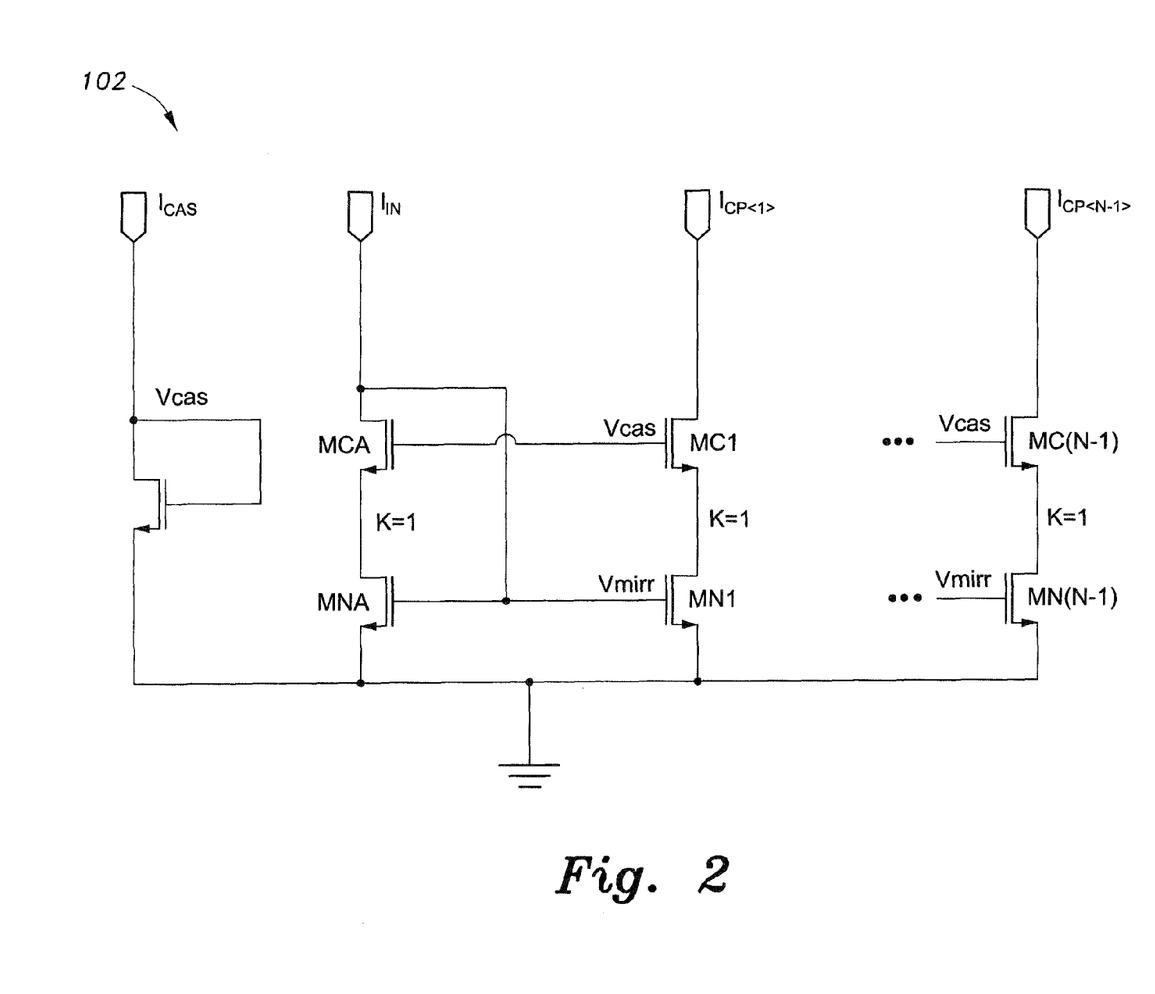
FIG. 2 is a schematic diagram of a current copier circuit for the current-mode folding amplifier of FIG. 1.
Figure 3:
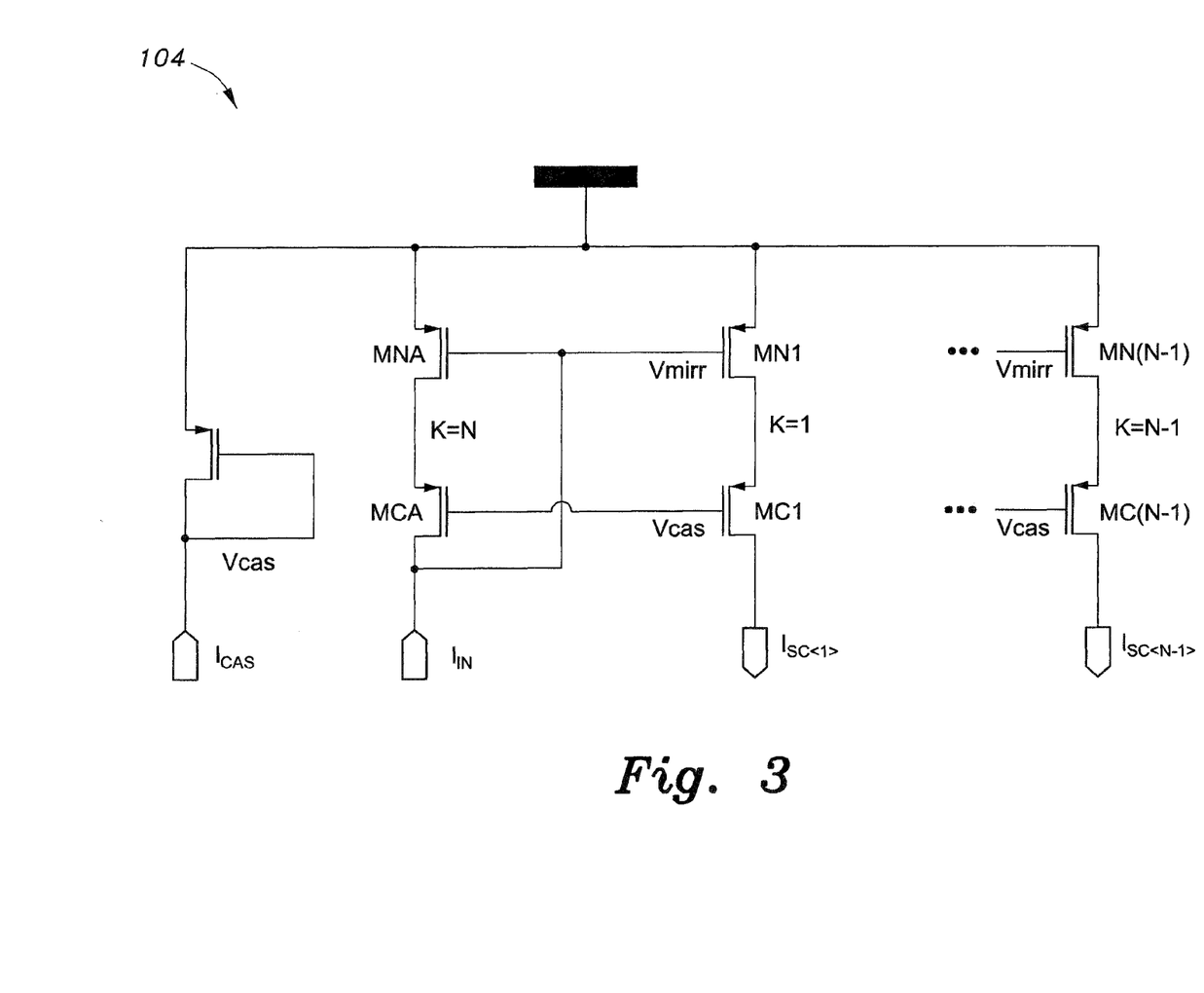
FIG. 3 is a schematic diagram of a reference current scaler circuit for the current-mode folding amplifier according to the present invention.
Figure 4:
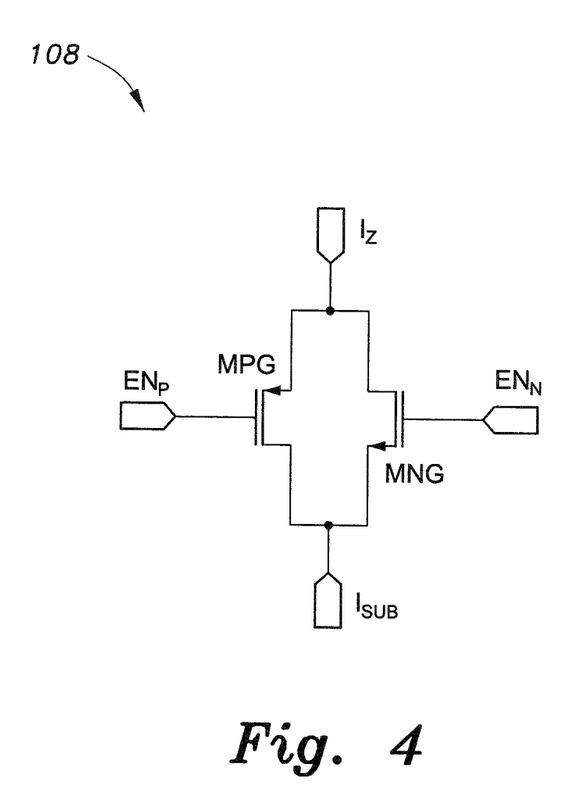
FIG. 4 is a circuit diagram of a transmission gate for the current-mode folding amplifier of FIG. 1.
Figure 5:
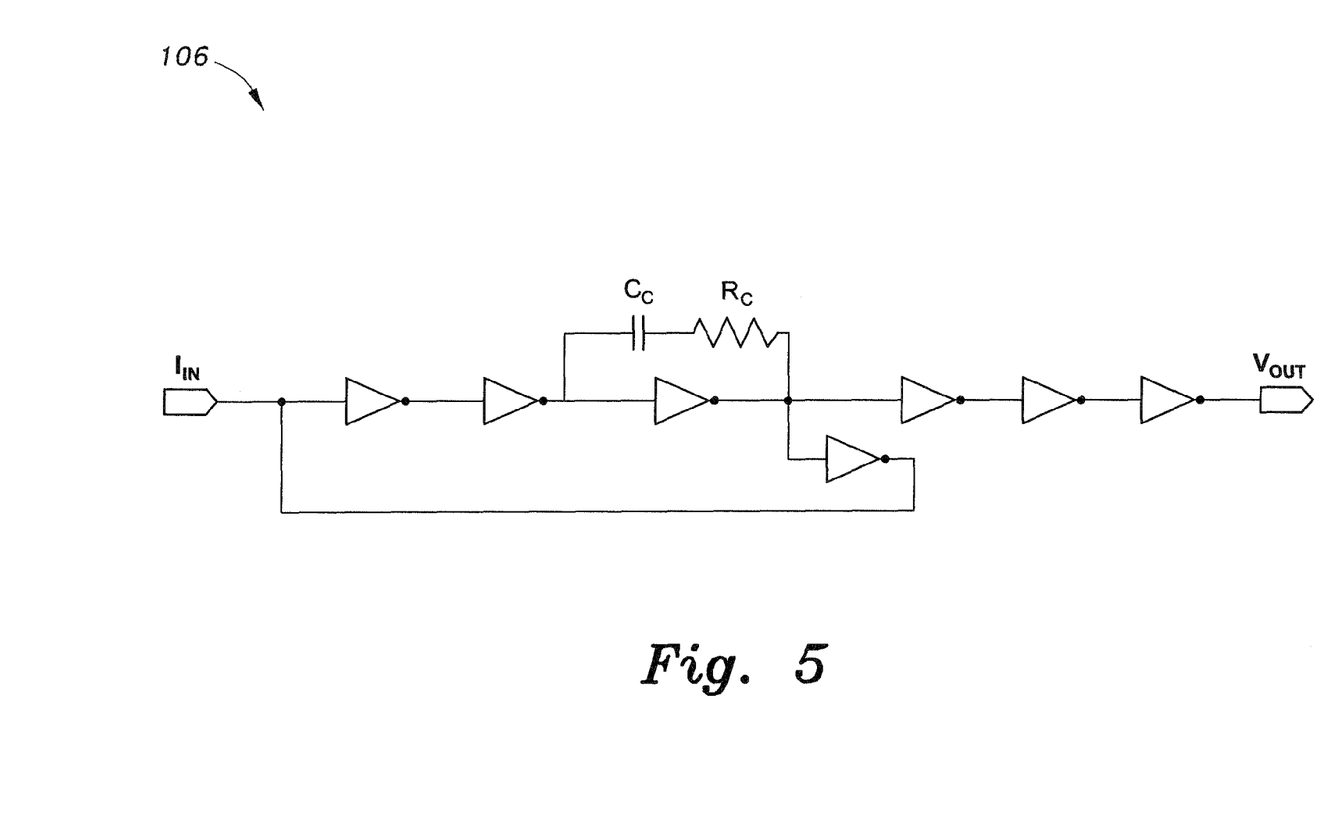
FIG. 5 is a circuit diagram of a current comparator for the current-mode folding amplifier of FIG. 1.
Figure 6A:
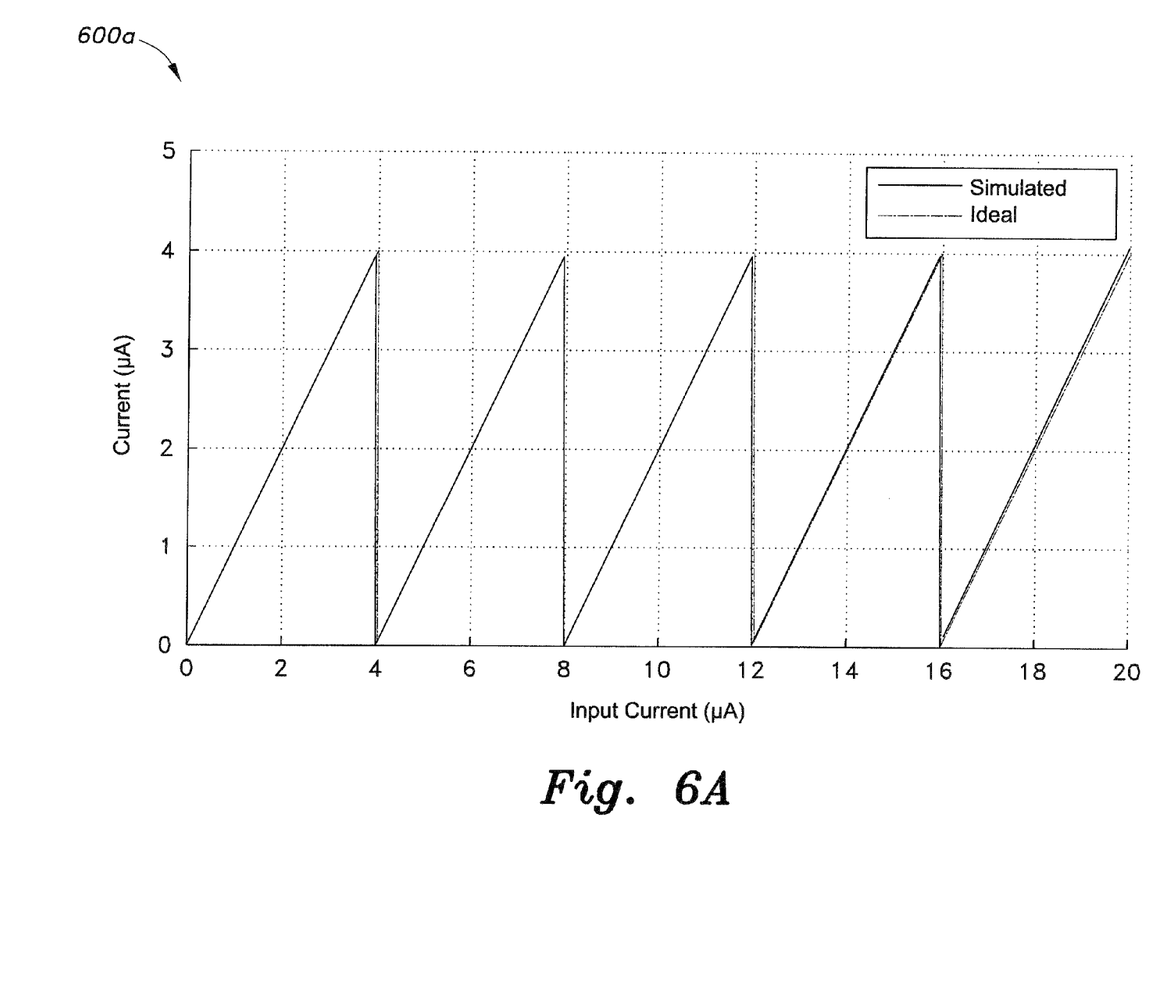
FIG. 6A is a plot of I/O characteristics of the current-mode folding amplifier according to the present invention.

The present folding amplifier 100, shown in FIG. 1, is characterized by the number of folds, N, and the fold size $I_F$. Conceptually, the folding amplifier maps the input into the output in a modulo division fashion. If the signal is larger than the fold size, then $I_F$ is repeatedly subtracted from it until the signal is smaller than the fold size. This leads to a saw-tooth characteristic 600a as shown in FIG. 6A. To realize such characteristics, two elements are required, namely, mirroring the input to output, and subtracting $I_F$ once the input is beyond certain points. These points are, of course, $I_F$, $2I_F$, $3I_F$, . . . $(N-1)I_F$ for an N-fold amplifier.

The present folding amplifier 100 is an implementation of the modulo division concept described in the preceding paragraph. The amplifier 100 has a first input current signal, $I_{IN}$, which feeds an NMOS first current mirror circuit configured as a current copier 102, and a second input reference current, $I_{REF}$, which feeds a second current mirror circuit configured as a reference scaler 104. The fold size in this case is $I_F=I_{REF}/N$. The two currents are fed to mirroring and scaling circuits, current copier 102 and reference scaler 104, respectively. The current copier produces N outputs, including N−1 copies, shown as $I_{CP}$ in FIG. 1, and one copy as $I_X$, which is fed directly to the output. The current scaler produces 2(N−1) outputs, including (N−1) outputs, that are scaled as $I_{REF}/N$, $2I_{REF}/N$, . . . , $(N-1)I_{REF}/N$, which are shown as $I_{SC}$. The other (N−1) outputs are all $I_{REF}/N$ and are shown as feedback input current $I_y$ in FIG. 1. $I_{SC}$ and $I_{CP}$ are subtracted from each other at the input of the comparator 106, which compares whether the resulting currents are greater or less than zero, effectively giving $B_{[i]}$=logic 1, for $I_{CP}[i]<I_{SC}[i]$ for i=1, 2, . . . , N−1. The binary signal $B_{[i]}$ is used to switch on/off the $i^{th}$ transmission gate (Tgate 108), which subtracts a current, $I_F=I_{REF}/N$, from the output, hence realizing folding. Notice that only one current mirror separates the input signal from the output.

The circuits used to realize these blocks, current copier 102, reference scaler 104, transmission gate 108, and comparator 106, are shown in FIGS. 2 through 5, respectively. Instead of using large channel length transistors in current mirrors, a folded cascode mirror is used for all mirroring. This allows the use of smaller channel length transistors (300 nm for all mirroring transistors), while not sacrificing accuracy (all mirrors give less than 2% error in simulations for currents from 1-32 μA). For the current scaler, the $I_Y$ output terminals are not shown, as they are similar to those used in the current copier. The cascode transistors are biased by a transistor that is one-half the width of the main transistor and biased by $I_{CAS}=35$ μA.

A well-known option for current comparison is the Traff comparator. However, the Traff comparator produces large delays for low currents (less than 0.5 u, this was found through simulations). Thus, the present current comparator 106 is a high speed, low input current, low voltage CMOS current comparator having the topology 106 shown in FIG. 5. The comparator 106 provides low input impedance and a small threshold current, which is needed for accurate comparison. The inverters were sized so that the feedback-connected inverter is around mid-supply point. This was 1 μm/150 nm for the NMOS, and 3 μm/150 nm for the PMOS.

The proposed folding amplifier was simulated in LFoundry 150 nm process with a supply of $V_{DD}=1.8$ V.

Figure 6B:
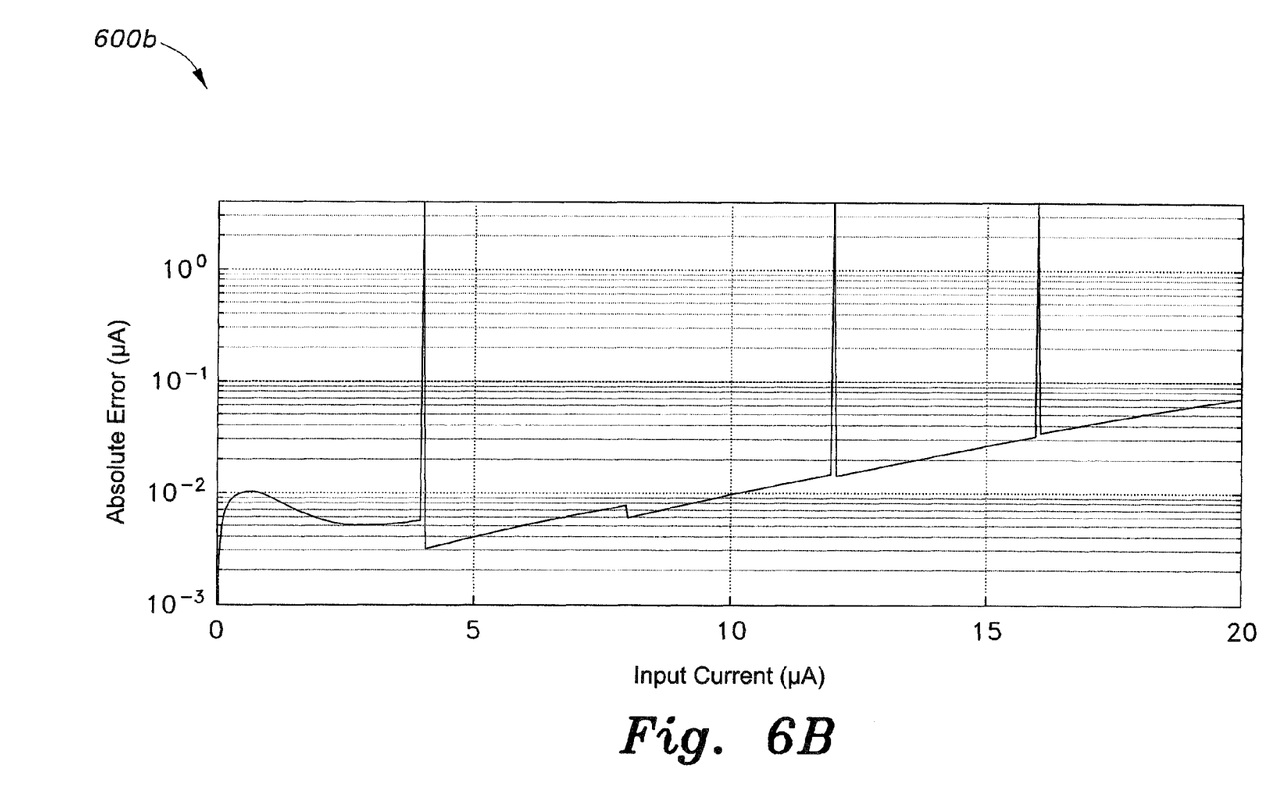
FIG. 6B is a plot showing absolute difference between simulated characteristics and ideal characteristics of the current-mode folding amplifier according to the present invention.

To compare against prior art, a folding amplifier with N=4 was designed, with a fold size of 4 μA and with a load resistance of 10 KΩ connected to mid-supply ($V_{DD}/2=0.9$ V). The input-output relationship is shown in plot 600a of FIG. 6A. This was obtained by performing a DC sweep of the input current from 0-20 μA at a step of 50 nA. The error between the ideal and the simulated characteristics is shown in plot 600b of FIG. 6B. The spikes are the misalignment of transition points from the ideal values of 4, 8, . . . , 20 μA. Ignoring the misalignment of the switching points from the ideal values, the maximum error is less than 0.07 μA at an input current of 20 μA.

Figure 7A:
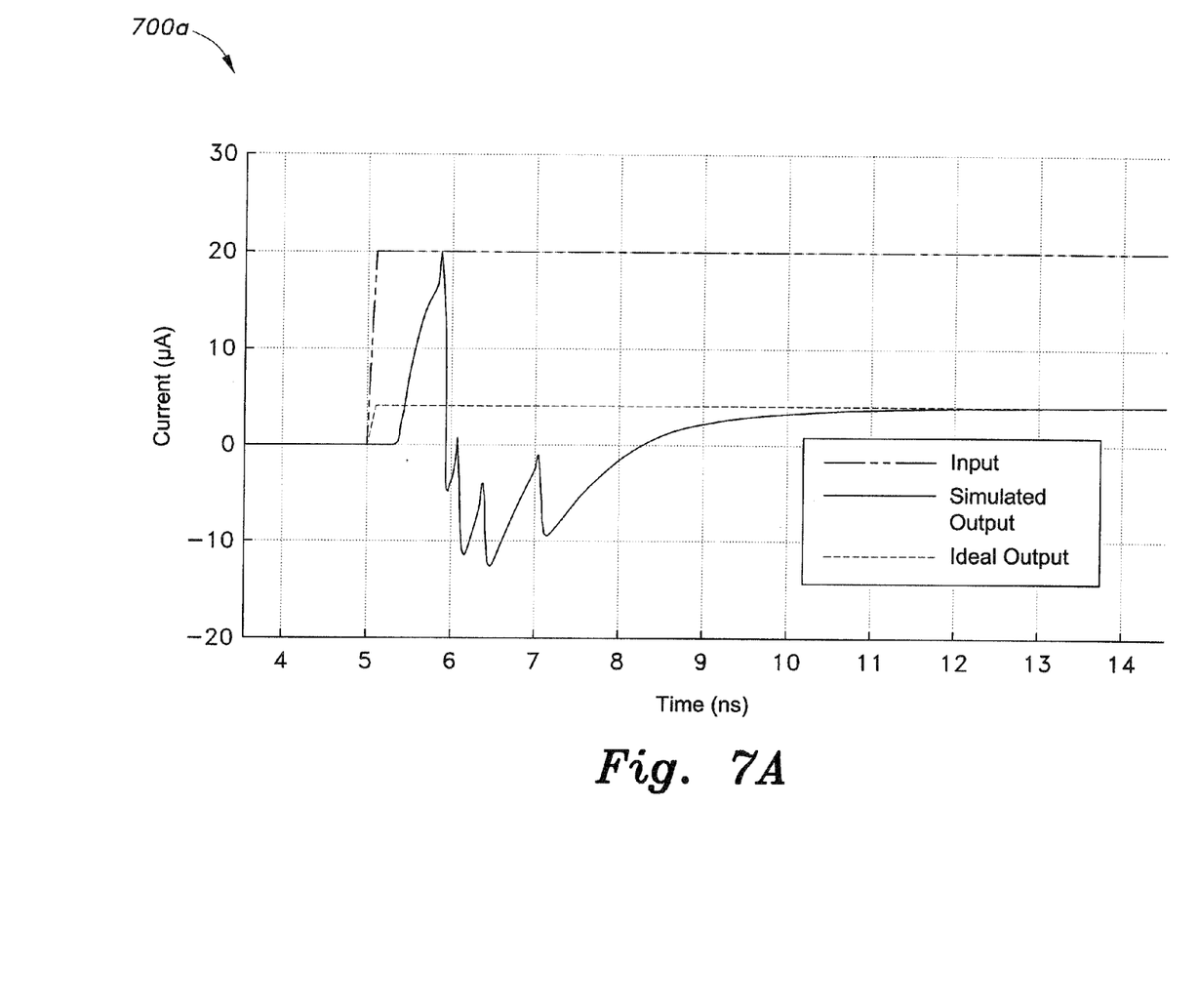
FIG. 7A is a plot showing transient response, according to the present invention.
Figure 7B:
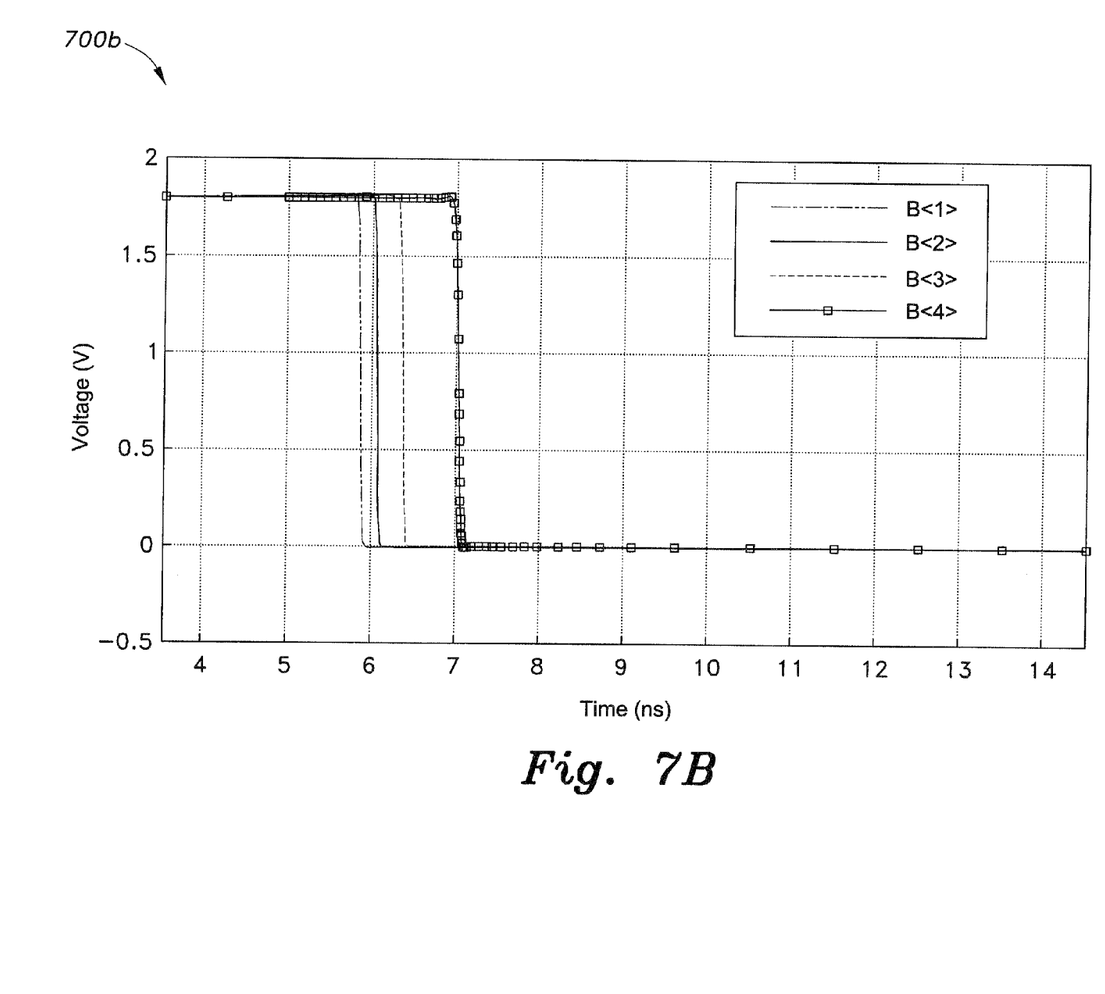
FIG. 7B is a plot showing current mirror switching response of the current-mode folding amplifier according to the present invention.
Figure 8A:
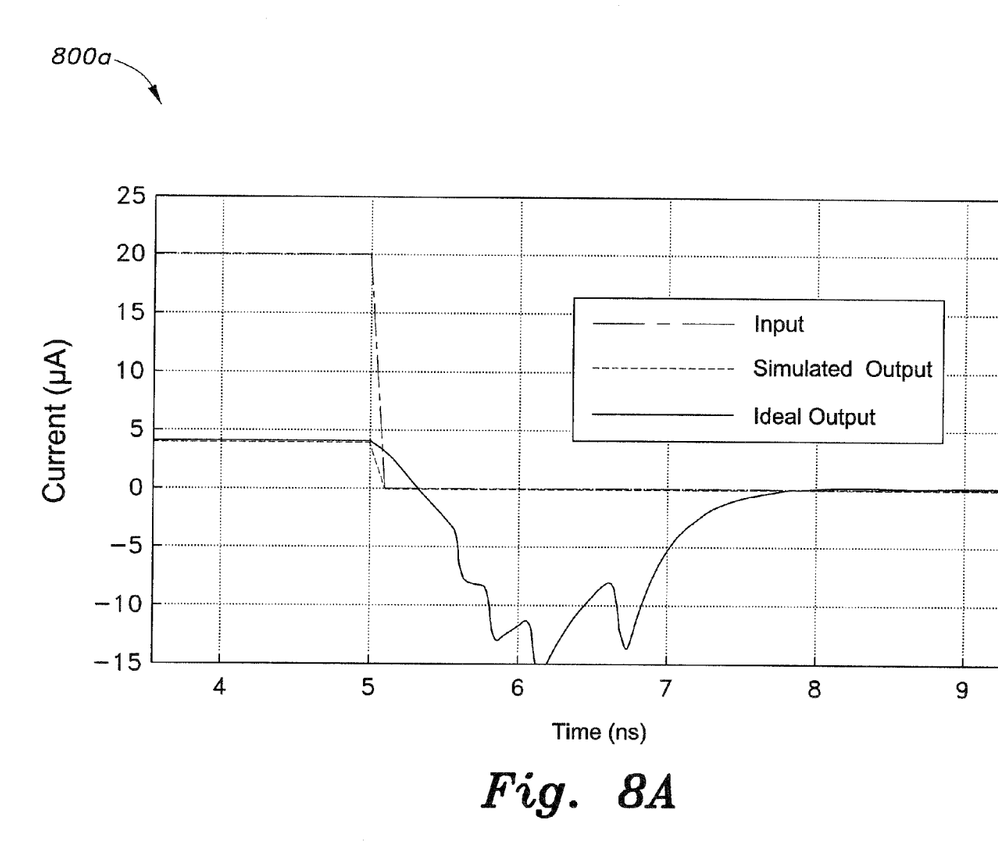
FIG. 8A is a plot showing transient response for a falling full-scale pulse signal in a current-mode folding amplifier according to the present invention.
Figure 8B:
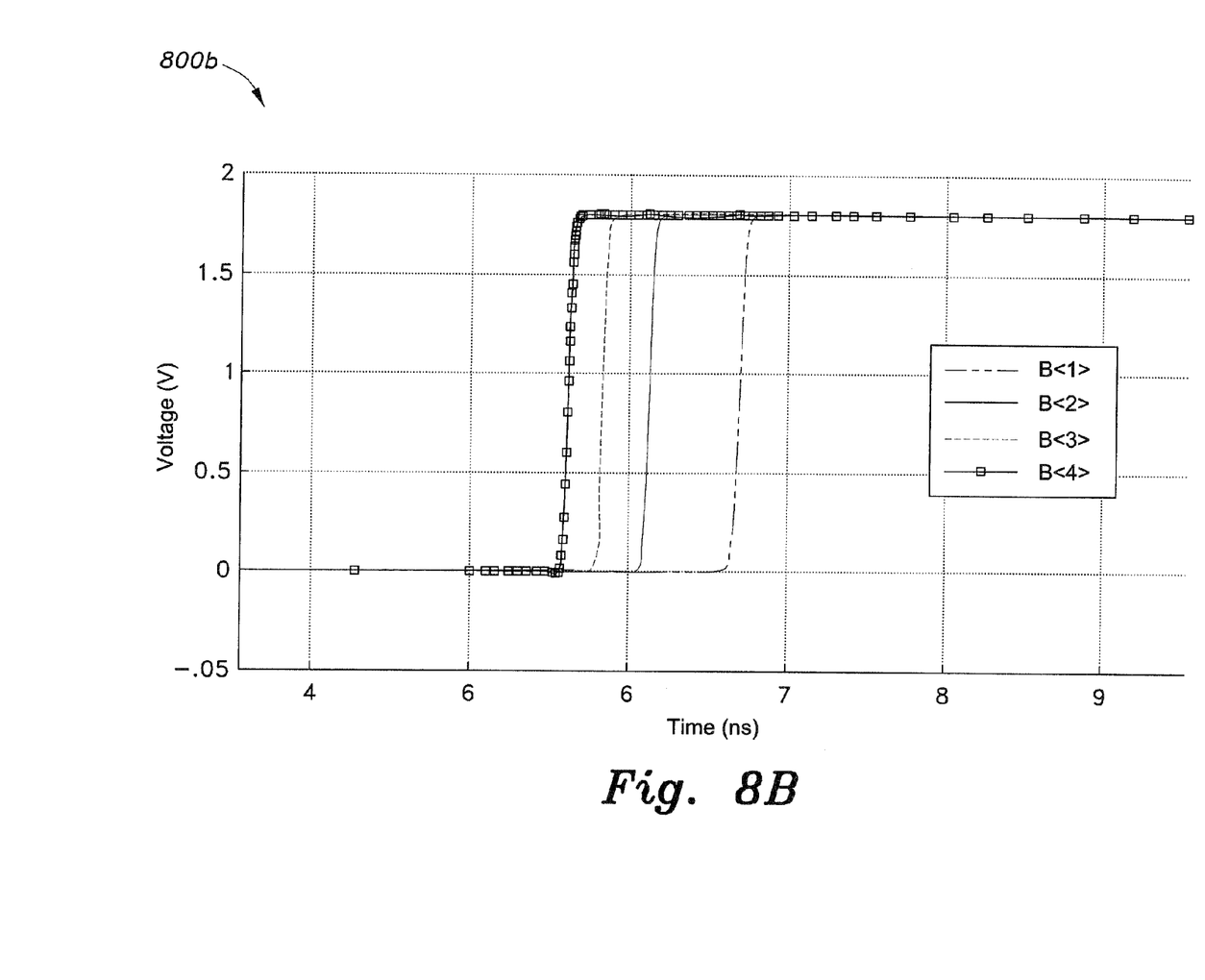
FIG. 8B is a plot showing current mirror switching response for a falling full-scale pulse signal in a current-mode folding amplifier according to the present invention.
Figure 9:
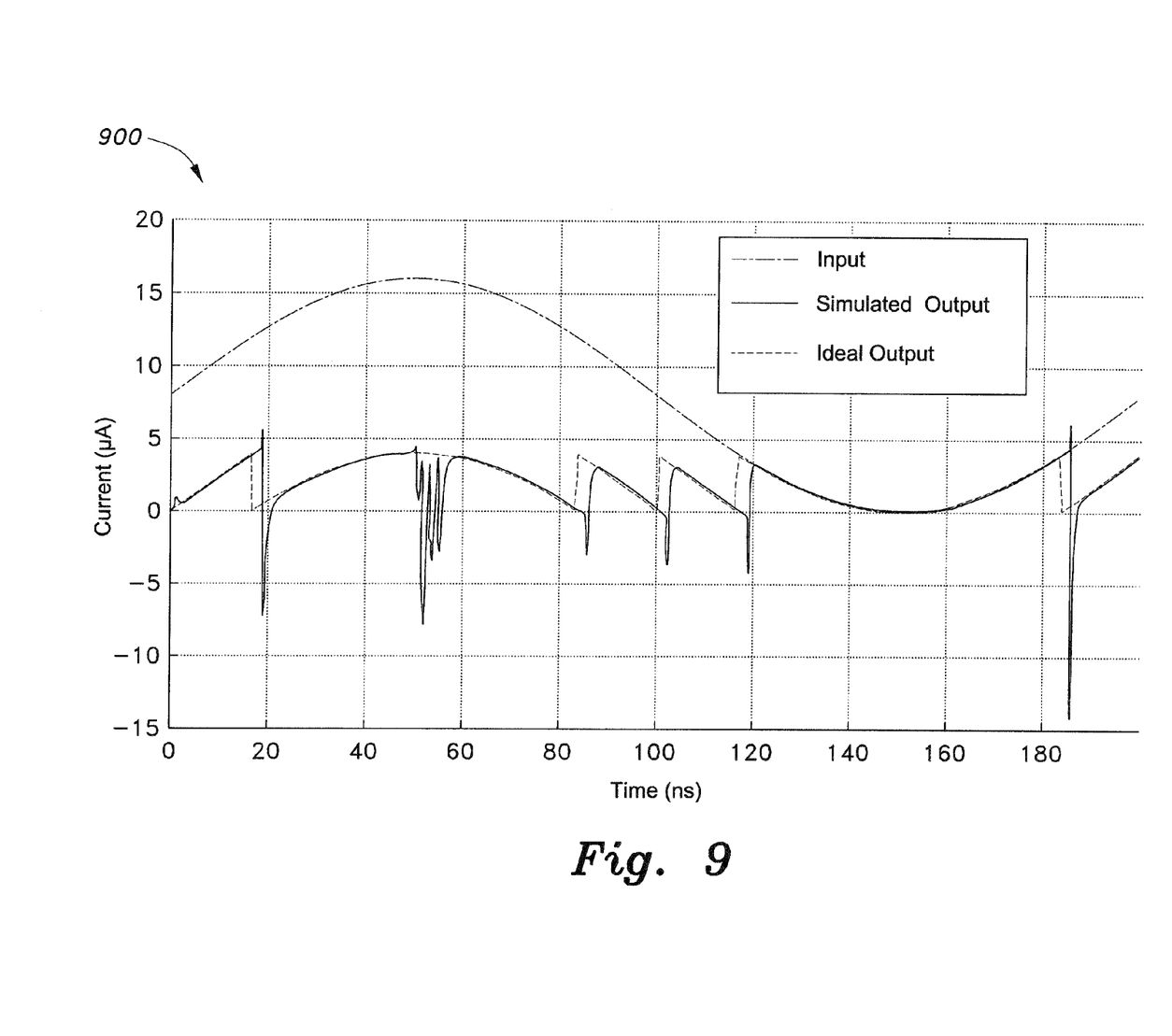
FIG. 9 is a plot showing response to a 5 MHz sinusoidal signal for a current-mode folding amplifier according to the present invention.

To test the response time of the amplifier, a rising full-scale pulse signal (from 0 μA to 20 μA) and falling full-scale pulse signal from (20 μA to 0 μA) are applied. These are shown in plot 700a of FIG. 7A and plot 800a of FIG. 8A, respectively. The comparator outputs are shown in plot 700b of FIG. 7B and plot 800b of FIG. 8B, respectively. Notice that the falling pulse settled much faster than the rising one. Also, we can notice very clearly in plot 700a the sudden jumps due to mirrors being switched on, which correspond to the switching instances in plot 700b. The 2% settling time was found to be 5.9 ns for the rising pulse and 2.3 ns for the falling pulse. Using the full scale delay, there is a fourfold improvement of speed over previously published results. All the comparators settled in, at most, 2 ns, while the main current mirror took about 4 ns after the last comparator to settle. An improvement to the current mirror can substantially improve the performance of folding amplifiers. A sinusoidal input of 5 MHz was applied to the folding amplifier. The results are shown in plot 900 of FIG. 9. The switching events follow the ideal switch instances within the delays predicted by the pulse test.

To test the scalability of the design, we scaled it up to N=8 with the same fold size ($I_F=4$ μA). The full scale value is now 32 μA. The mirrors become slower as the number of output branches increases. The settling time for the full scale rising and falling pulses increase to 8.4 ns and 3.5 ns respectively.

It is to be understood that the present invention is not limited to the embodiments described above, but encompasses any and all embodiments within the scope of the following claims.

We claim:

1. A current-mode folding amplifier, comprising:
    a comparator circuit having a binary output $B_{[i]}$ and an input;
    a first current mirror circuit configured as a current copier, the current mirror circuit accepting an input current $I_{IN}$ and providing a current $I_X=I_{IN}$ included in an output of the current-mode folding amplifier, and a current $I_{CP}[i]=I_{IN}$ fed to the input of the comparator circuit;
    a transmission gate circuit accepting the binary output $B_{[i]}$ as its input and accepting a gating current $I_{[i]}=B_{[i]}I_Z[i]$ derived from the output of the current copier, the transmission gate providing a feedback current $I_Z[i]=I_{REF}/N$;
    a second current mirror circuit configured as a reference scaler having the current $I_{REF}$ as its input, and a feedback current $I_Y[i]=I_{REF}/N$, derived from the transmission gate feedback current $I_Z[i]=I_{REF}/N$, and providing a current $I_{SC}[i]=i*I_{REF}/N$ fed to the input of the comparator circuit, $I_{SC}$ and $I_{CP}$ being subtracted from each other at the input of the comparator circuit in order to compare whether the resulting currents are greater or less than zero, where N is a number of folds for an N fold, folding points being characterized as $I_F$, $2I_F$, $3I_F$, . . . $(N-1)I_F$.

2. The current-mode folding amplifier according to claim 1, wherein the current reference scaler has 2(N−1) outputs, a first (N−1) outputs being scaled as $I_{REF}/N$, $2I_{REF}/N$, . . . $(N-1)I_{REF}/N \cong I_{SC}$, and a second (N−1) outputs $\cong I_{REF}/N$.

3. The current-mode folding amplifier according to claim 2, wherein the current mirror circuits are configured as folded cascode mirrors.

4. The current-mode folding amplifier according to claim 3, wherein the current mirror circuits include transistors, the transistors having channel lengths of up to 300 nm.

5. The current-mode folding amplifier according to claim 4, further comprising a biasing transistor having one-half the width of the transistors used in the current mirror circuits, the biasing transistor providing a biasing current $I_{CAS} \cong 35$ μA.

* * * * *